United States Patent [19]
Yang

[11] Patent Number: 5,518,938
[45] Date of Patent: May 21, 1996

[54] PROCESS FOR FABRICATING A CMOS TRANSISTOR HAVING HIGH-VOLTAGE METAL-GATE

[75] Inventor: Sheng-Hsing Yang, Hsinchu, Taiwan

[73] Assignee: United Microelectronics Corporation, Hsinchu, Taiwan

[21] Appl. No.: 435,074

[22] Filed: May 8, 1995

[51] Int. Cl.⁶ .............................................. H01L 21/8238
[52] U.S. Cl. ................... 437/34; 437/44; 437/56; 437/58; 437/69; 148/DIG. 82
[58] Field of Search ................... 437/34, 40, 41, 437/44, 56, 58, 59, 69, 913; 148/DIG. 82

[56] References Cited

U.S. PATENT DOCUMENTS

| | | | |
|---|---|---|---|
| 4,717,683 | 1/1988 | Parrillo et al. | 437/34 |
| 5,019,879 | 5/1991 | Chin | 437/44 |
| 5,192,699 | 3/1993 | Bulat et al. | 437/41 |
| 5,314,833 | 5/1994 | Lee et al. | 437/41 |
| 5,342,803 | 8/1994 | Shimoji | 437/69 |
| 5,376,568 | 12/1994 | Yang | 437/40 |

*Primary Examiner*—Tuan H. Nguyen
*Attorney, Agent, or Firm*—Townsend and Townsend and Crew

[57] ABSTRACT

A process for fabricating a high-voltage metal-gate CMOS transistor is disclosed. The CMOS transistor comprises a pair of complementary NMOS and PMOS transistors. The CMOS transistor is fabricated on an semiconductor substrate of a first conductivity type, which has a well region of a second conductivity type therein; therefore, the PMOS and NMOS are fabricated onto the substrate or well region, separately. It can be understood that use of the opening prepared in the initial, and, the only primary shielding layer for the location of the source/drain regions of both the NMOS and PMOS transistors, comprises the key to the precision alignment, and to the dimensional symmetry of the transistors fabricated. This is because that the subsequent fabrication procedural steps after the formation of the shielding layer with the set openings, including all the deposition, the ion implantation, and the etching, etc., all utilize the single positioned reference as set up in the initial shielding layer, with its initial openings defining the locations of the source/drain, as well as the gate regions for the transistors. This allows to ensure the uniformity of the electrical characteristics of the transistor device as fabricated, in each of the process batches. Furthermore, the relatively flat surface of the fabricated transistor pair, after the metal-gate and contacts are formed, also helps to assist the progress of the subsequent device fabrication procedures.

16 Claims, 7 Drawing Sheets

PROCESS FOR FABRICATING A CMOS TRANSISTOR HAVING HIGH-VOLTAGE METAL-GATE

BACKGROUND OF THE INVENTION

1. Field of the Invention

The present invention relates in general to the process for fabricating CMOS transistors. In particular, the present invention relates to a process for fabricating CMOS transistors having high-voltage metal-gates. More particularly, the present invention relates to a process for fabricating CMOS transistors having heavily-doped source and drain terminals that are precisely formed in symmetry respectively within the lightly-doped source and drain regions, and featuring precisely controlled uniformity of the transistor characteristics for the high-voltage metal-gate CMOS transistors fabricated.

2. Technical Background

Conventional processes for fabricating high-voltage metal-gate CMOS transistors suffer from poor dimensional alignment and symmetry for the fabricated source/drain terminals that are prerequisites for the uniformity of the transistor characteristics for these CMOS transistor devices fabricated. The poor alignment and symmetry characteristics found in the conventional fabrication processes are inherent in the nature of the fabrication process steps employed. Poor alignment and dissymmetry in the source and drain regions of the CMOS transistor result in variations of the electrical characteristics for the CMOS transistors produced in different production batches, as the fabrication process conditions may vary for the alignments involved in the process steps.

SUMMARY OF THE INVENTION

It is therefore the primary object of the present invention to provide a process for fabricating CMOS transistors having high-voltage metal-gates with the heavily-doped source and drain terminals precisely formed in uniform symmetry.

The present invention achieves the above-identified objects by providing a process for fabricating high-voltage metal-gate CMOS transistor. The CMOS transistor comprises a pair of complementary NMOS and PMOS transistors. The CMOS transistor is fabricated on an semiconductor substrate of a first conductivity type, which has a well region of a second conductivity type therein; therefore, the PMOS and NMOS are fabricated onto the substrate or well region, separately. It can be understood that use of the opening prepared in the initial, and, the only primary shielding layer for the location of the source/drain regions of both the NMOS and PMOS transistors, comprises the key to the precision alignment, and to the dimensional symmetry of the transistors fabricated. This is because that the subsequent fabrication procedural steps after the formation of the shielding layer with the set openings, including all the deposition, the ion implantation, and the etching, etc., all utilize the single positioned reference as set up in the initial shielding layer, with its initial openings defining the locations of the source/drain, as well as the gate regions for the transistors. This ensures the uniformity of the electrical characteristics of the transistor device as fabricated, throughout every process batches. Furthermore, the relatively flat surface of the fabricated transistor pair, after the metal-gate and contacts are formed, also helps to assist the progress of the subsequent device fabrication procedures.

BRIEF DESCRIPTION OF THE DRAWING

Other objects, features and advantages of the present invention will become apparent by way of the following detailed description of the preferred but non-limiting embodiment. The description is made with reference to the accompanied drawings, wherein.

DETAILED DESCRIPTION OF THE PREFERRED EMBODIMENTS

A preferred embodiment of the process in accordance with the present invention for fabricating the high-voltage metal-gate CMOS transistor with precision alignment and dimensional symmetry is described below. When the inventive process is described, the procedural steps for fabricating both the NMOS and PMOS transistors for the CMOS transistor configuration are simultaneously exemplified, utilizing the accompanying two sets of drawing of the present invention.

As persons skilled in the art may well appreciate, the process of the present invention may be applicable to a semiconductor silicon substrate of either the N-type with the P-type well region, or to a substrate of P-type with the N-type well region, although it is an N-type substrate employed for the description. Since the NMOS and PMOS transistors that constitute the complementary pair are fabricated on the same substrate, if an N-type substrate is employed, as in the case of the exemplified embodiment depicted in the drawings, then for the NMOS transistor, a P-well will have to be prepared. On the other hand, no corresponding N-well is required for the PMOS transistor. This is reflected by the presence of the P-well 10 in FIGS. 1A–1G of the drawing.

During the following process of the description of the present invention, the general terms of "first conductivity type" and "second conductivity type" will be used to designate either the N-type and P-type, or the P-type and N-type respectively.

Stage 1

Figure 1A:
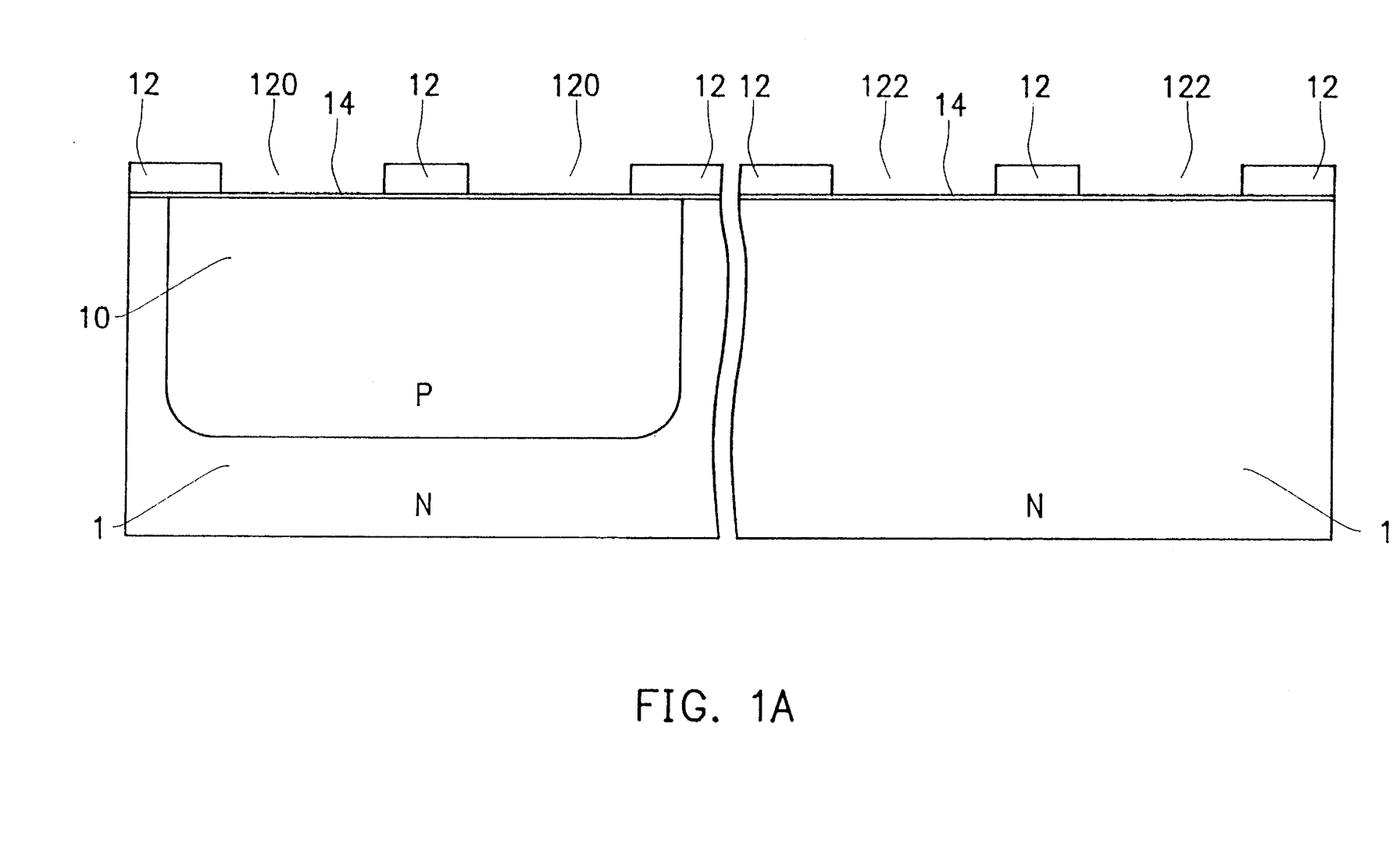
FIGS. 1A–1G, respectively, show schematically the cross-sectional views of the high-voltage metal-gate CMOS transistors fabricated in the process in accordance with a preferred embodiment of the present invention as depicted in the selected process stages, wherein the left hand side shows an NMOS transistor and the right hand side shows a PMOS transistor.

As is shown in FIG. 1A, on the surface of a substrate 1 of the first conductivity type having the pre-fabricated well region 10 of the second conductivity type, a shielding layer 12 may be formed to cover the surface of the silicon substrate 1. The shielding layer 12 is properly configured with the required openings 120 and 122 that constitute the exposed windows for the subsequent processing of forming the lightly-doped drain and source regions for the transistors.

This may be achieved by, for example, growing a pad oxide layer 14 first, and then forming the shielding layer 12 by depositing polysilicon or oxides. The exposing windows 120 and 122 may be formed by performing an etching process to the designated areas for the openings 120 and 122 by implementing a lithography procedure well known in the art.

Stage 2

Figure 1B:
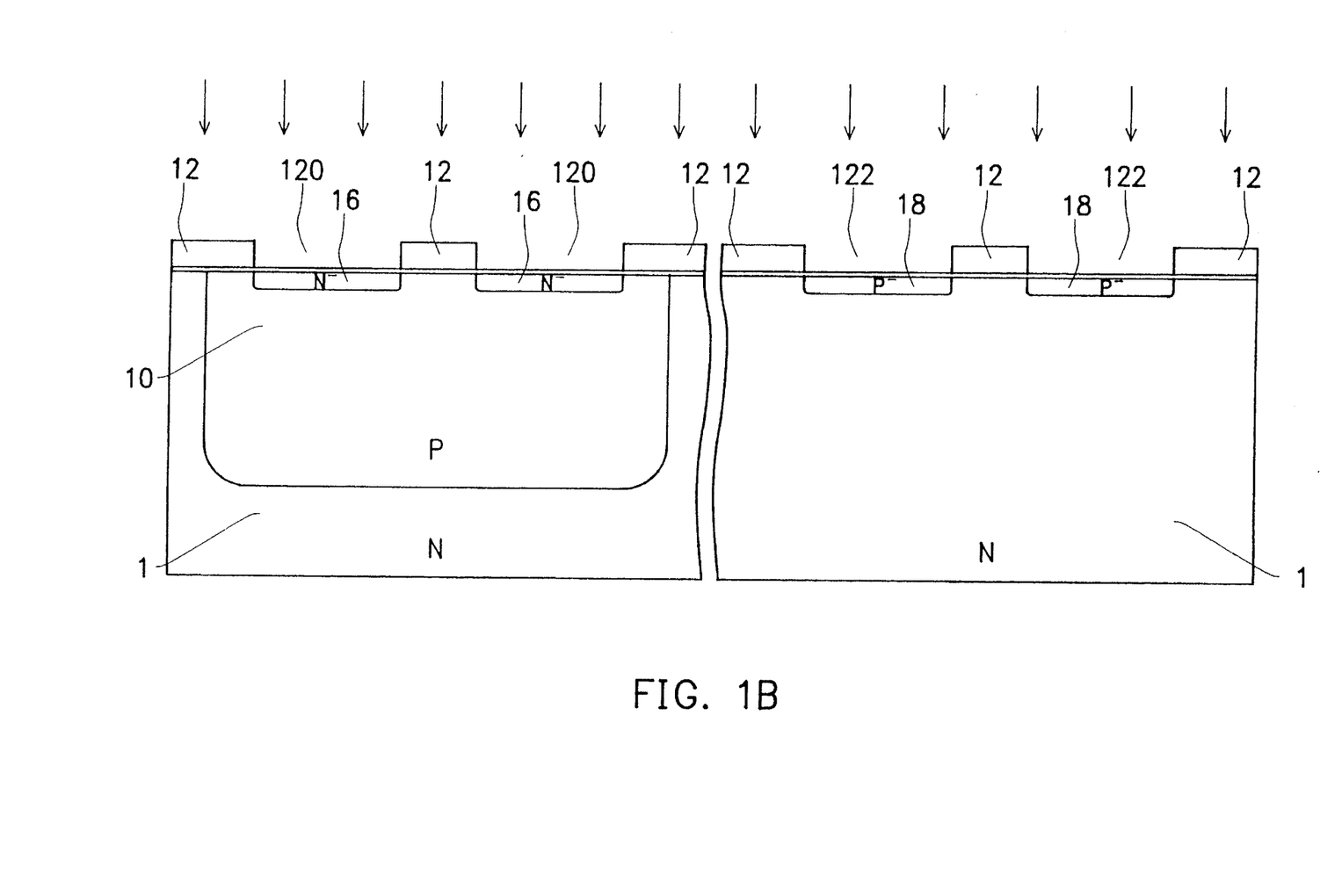

Next, referring to FIG. 1B, the shielding layer 12 with their exposing openings 120 and 122 may then be utilized as the shield for the controlled doping procedures that form the lightly-doped drain and source regions 16 and 18 respectively for the NMOS and PMOS transistors.

For example, in the case of the NMOS transistor in FIG. 1B, the controlled doping procedure, for example, an ion implantation procedure, may be performed to implant N-type impurities such as, for example, $p^{31}$ into the exposed regions of the P-well region 10 defined by the exposing openings 120. The result is the formation of the lightly-doped N⁻-type drain and source regions 16 as shown in FIG. 1B. On the other hand, for the PMOS transistor, a similar doping procedure, for example, another ion implantation procedure, may be performed to implant P-type impurities such as, for example, $B^{11}$ into the exposed regions of the N-type substrate 1 defined by the exposing openings 122. The result is the formation of the lightly-doped P⁻-type drain and source regions 18 as shown.

Stage 3

Figure 1C:
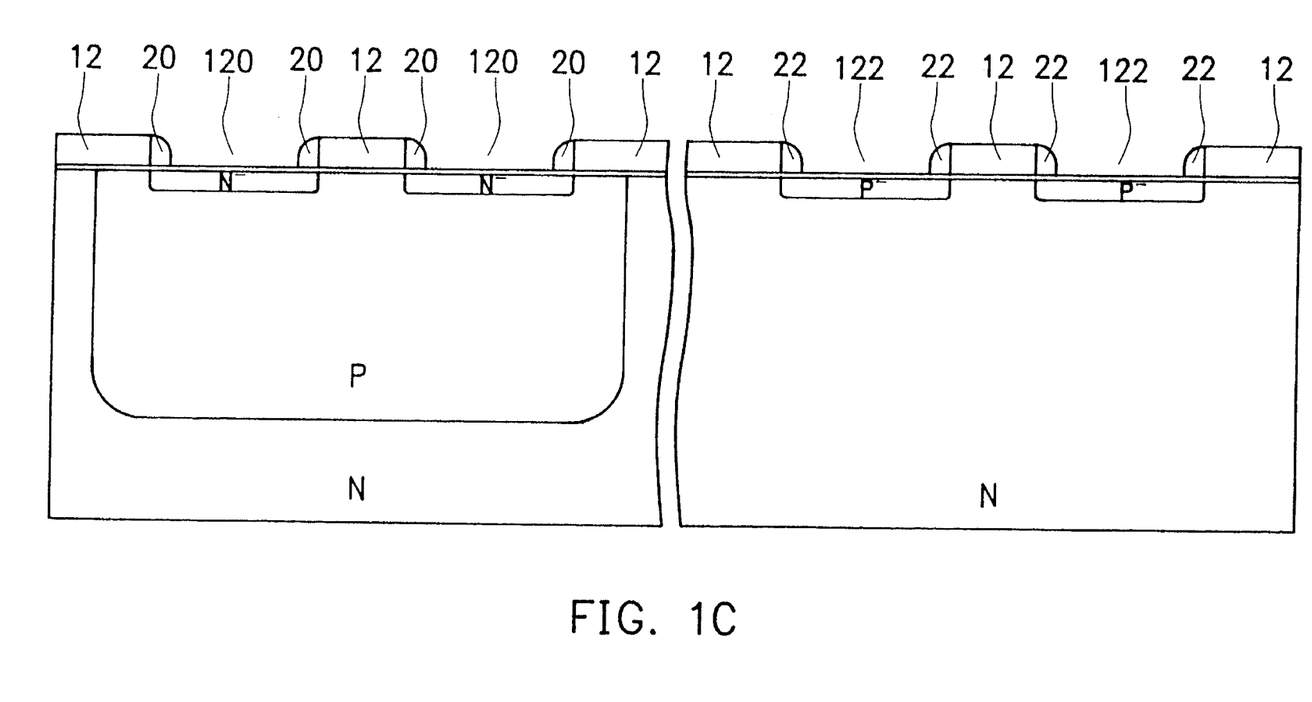

Then, as in FIG. 1C, the sidewalls of the openings 120 and 122 of both the NMOS and PMOS transistors are covered by the sidewall spacers 20 and 22 respectively.

This may be done by, for example, in the case of both the NMOS and PMOS transistors of FIG. 1C respectively, depositing nitrides on the surface of the silicon substrate at this stage, and then performing an etch back process to obtain the sidewall spacers 20 and 22 as shown in FIGS. 1c and 2c respectively.

Stage 4

Figure 1D:
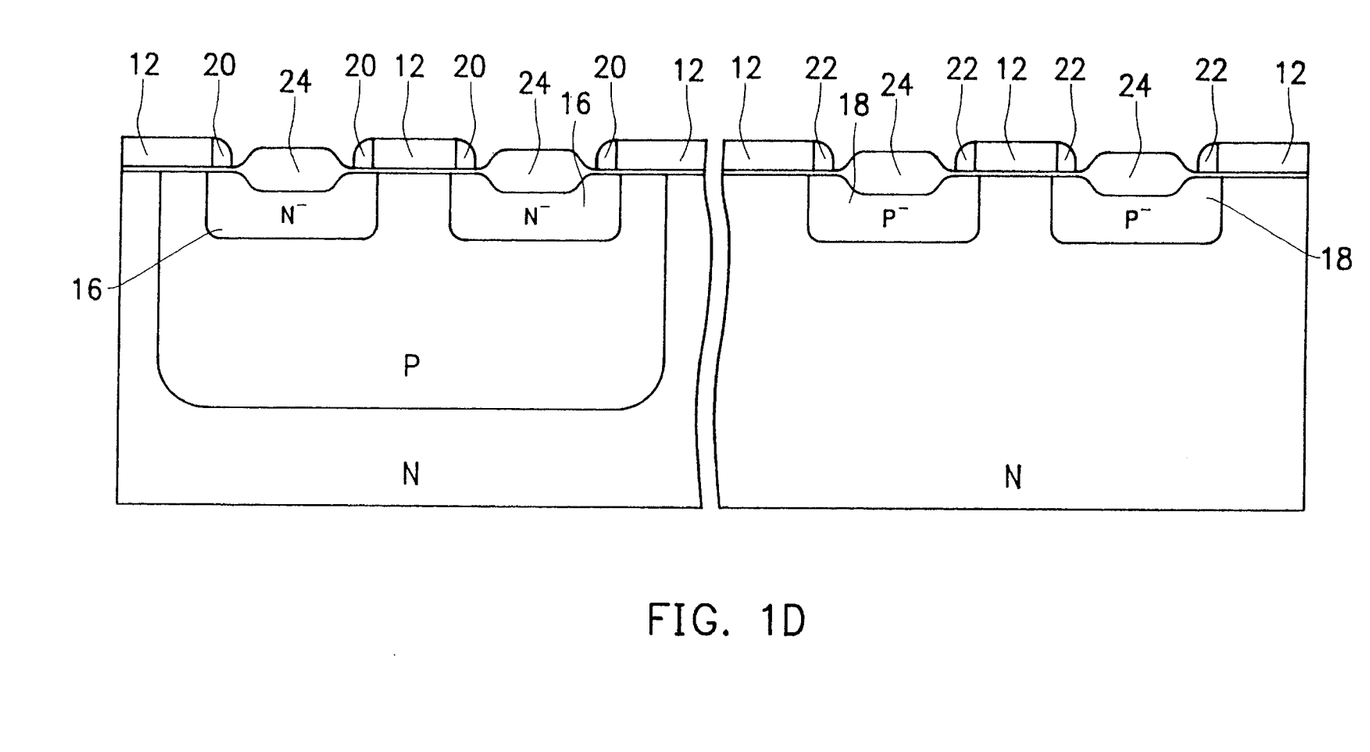

Refer next to FIGS. 1D, the shielding layer 12 and the sidewall spacers 20 and 22 are then utilized as the shielding masks for the implementation of a thermal oxidation procedure that can be applied to both the NMOS and the PMOS transistors simultaneously to form the field oxide layers 24 for both transistors.

The result of this oxidation is the formation of the field oxide layers 24 for both the NMOS and PMOS transistors within their respective source and drain regions 16 and 18 that are exposed for the thermal oxidation procedure. Also as a result of this thermal oxidation procedure, the depths of the lightly-doped source and drain regions 16 and 18 for both the NMOS and PMOS transistors are increased as the impurities implanted may further diffuse into the P-well region 10 and the N-type substrate 1 for the NMOS and PMOS transistors respectively. This is schematically shown in the relative dimensions of the thickness of the source/drain regions 16 and 18 in FIGS. 1C and 1D respectively.

Stage 5

Figure 1E:
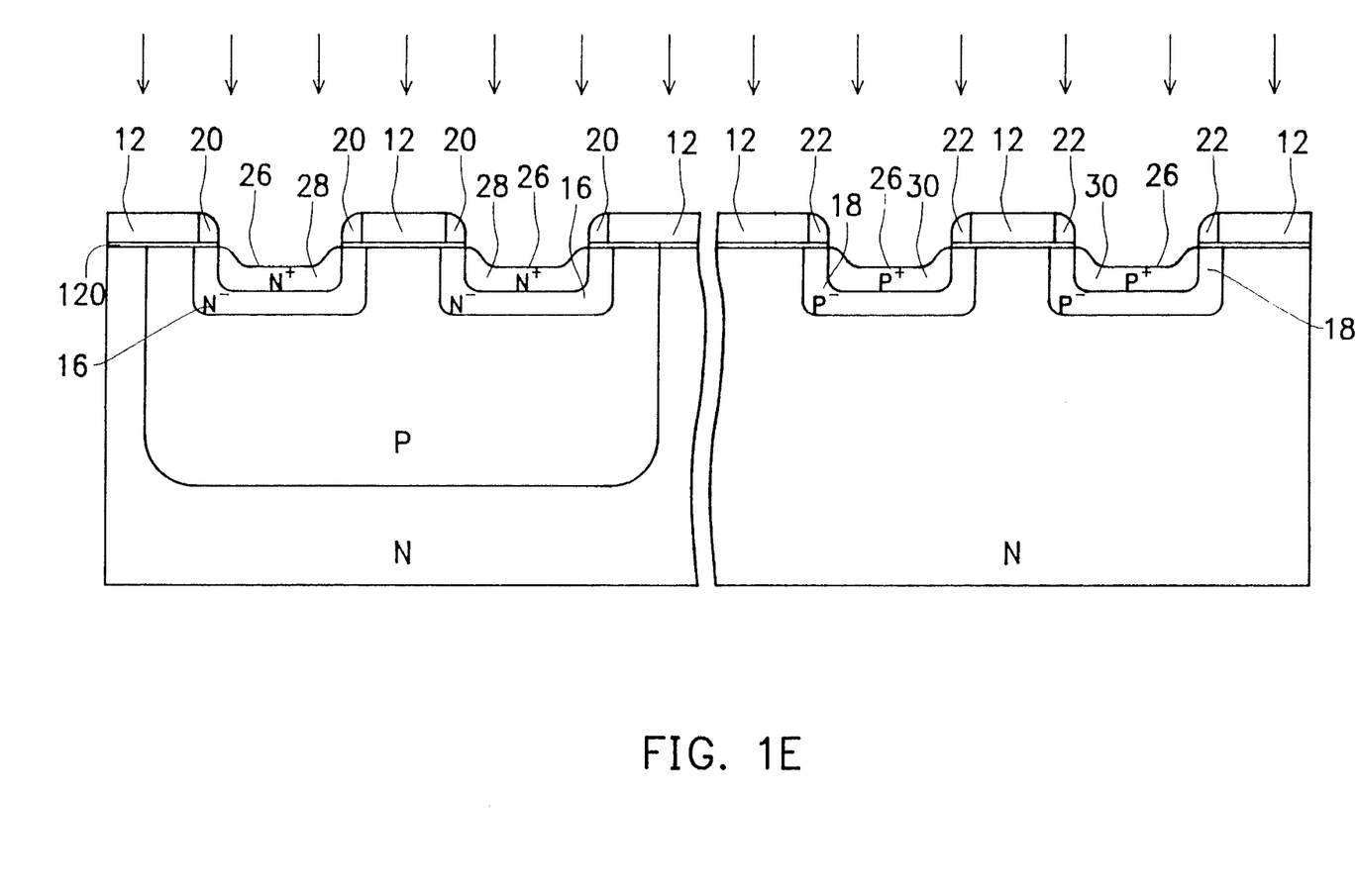

Then, in FIG. 1E, the field oxide layers 24 formed in the source/drain regions of both the NMOS and PMOS transistors are removed, leaving the recesses 26 as shown. The shielding layer 12 and the sidewall spacers 20 and 22 are again utilized as the shielding masks for another set of doping procedures performed separately for the NMOS and PMOS transistors. The purpose of these doping procedures is to form the heavily-doped regions 28 and 30 within the lightly-doped source/drain regions 16 and 18 of both the NMOS and the PMOS transistors respectively.

In the case of the NMOS transistor, this may be achieved by, for example, first implementing an ion implantation procedure for implanting N-type impurities into the lightly-doped N⁻-type source/drain regions 16 as exposed out of the shielding of the shielding layer 12 and the sidewall spacers 20. The implantation energy, and the impurity concentration are controlled to result in the formation of the heavily-doped N⁺-type layers 28 within the source/drain regions 16 that have been relatively lightly doped.

In a similar procedure, for the case of the PMOS transistor, this may be achieved by, for example, subsequently implementing an ion implantation procedure for implanting P-type impurities into the lightly-doped P⁻-type source/drain regions 18 as exposed out of the shielding of the shielding layer 12 and the sidewall spacers 22. The implantation energy, as well as the impurity concentration, are controlled to result in the formation of the heavily-doped P⁺-type layers 30 within the source/drain regions 18 that have been relatively lightly doped.

With the conclusion of the formation of the heavily-doped regions in the source/drain regions of both the NMOS and PMOS transistors, the shielding layer 12, the sidewall spacers 20 and 22, as well as the pad oxide layer 14 may then be removed, utilizing procedures known in the art.

Stage 6

Figure 1F:
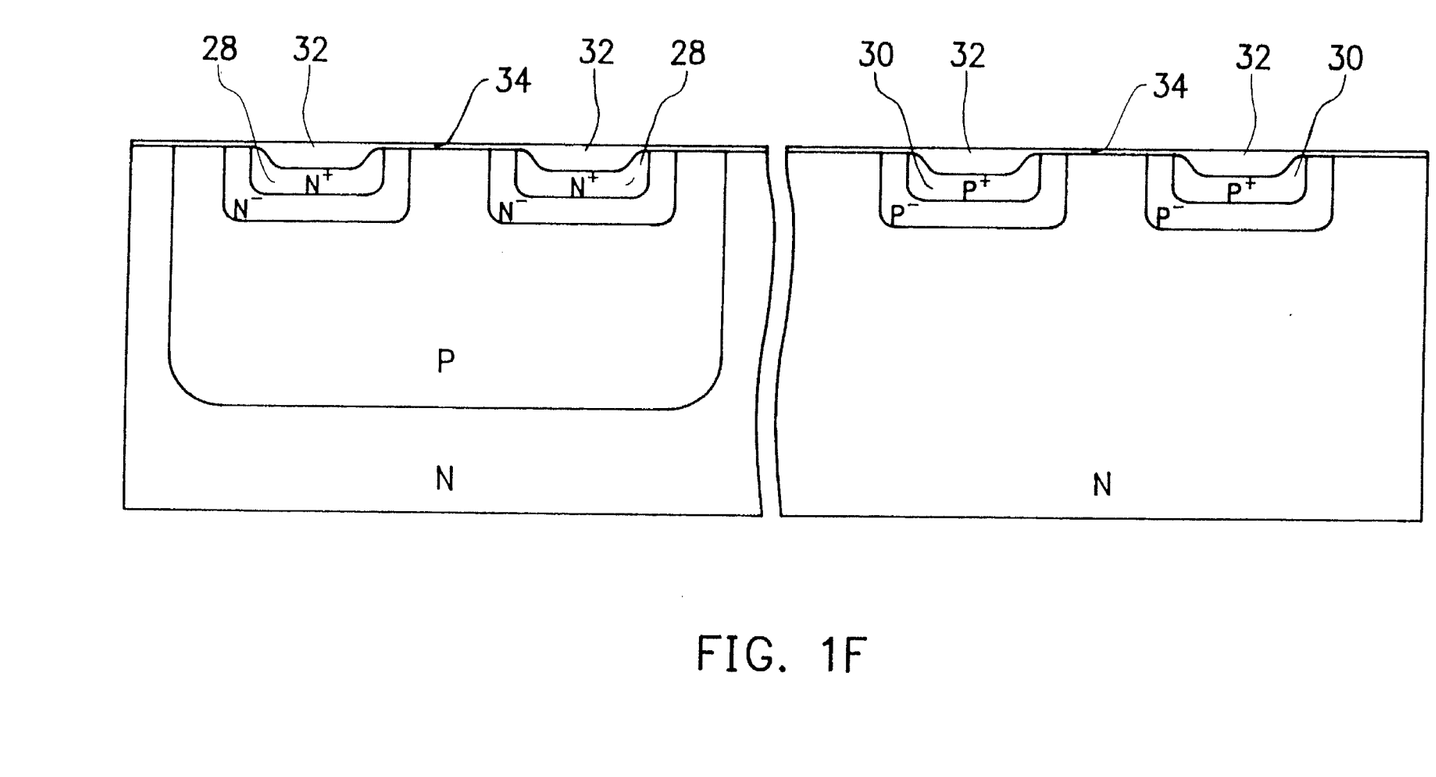

Then, in FIG. 1F, a further thermal oxidation procedure is performed to form a layer of insulating oxide layer 32 covering the source/drain regions with the heavily-doped N⁺ regions 28 for the NMOS transistor, and the source/drain regions with the heavily-doped P⁺ region 30 for the PMOS transistor. The same thermally formed gate dielectric layer, at the portion as designated by 34 reference numeral, also covers the gate region of each of the NMOS and PMOS transistors located between the source and drain regions. A review to the drawing of FIG. 1f, shows that the thickness of the insulating oxide layer 32 covering the source/drain regions is much greater than that of the layer 34 covering the gate region because of the concentration deviation therebetween.

Stage 7

Figure 1G:
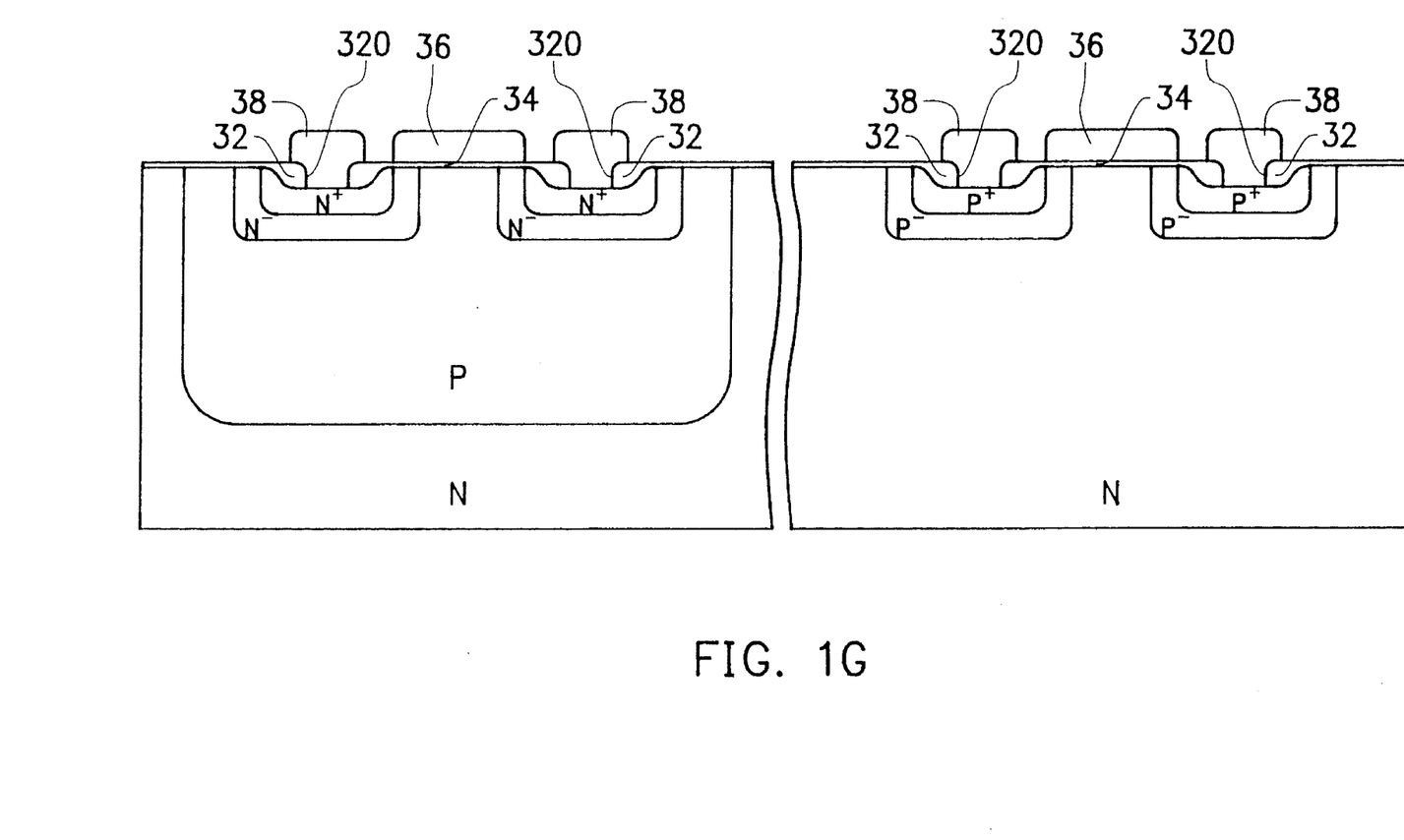

Finally, as is seen in FIG. 1G, the contact window 320 is opened in the insulating oxide layer between the layer portion 32 and 34. Within this contact window 320, the entire thickness of the oxide layer 32 is cleared, exposing the heavily-doped source/drain regions thereunder. This allows for the formation of the metal contact 38 that leads to the source/drain regions of both the NMOS and PMOS transistors. On the other hand, another kind of metal contact, the metal-gates 36 are formed over the gate dielectric layer 34 on top of the gate region of both the NMOS and the PMOS transistors, as is seen in FIG. 1G.

This generally concludes the fabrication of the basic CMOS transistor comprising the NMOS and PMOS transistor pair. As is appreciable after reading the above description of the fabrication process in accordance with the exemplified preferred embodiment, persons skilled in the art may acknowledge the facts of the advantages inherent to the process of CMOS transistor fabrication as disclosed by the present invention.

Among the most important advantages, it can be understood that use of the opening prepared in the initial, and, the only primary shielding layer for the location of the source/drain regions of both the NMOS and PMOS transistors, comprises the key to the precision alignment, and to the dimensional symmetry of the transistors fabricated. This is because that the subsequent fabrication procedural steps after the formation of the shielding layer with the set openings, including all the deposition, the ion implantation, and the etching, etc., all utilize the single positioned reference as set up in the initial shielding layer, with its initial openings defining the locations of the source/drain, as well as the gate regions for the transistors. This allows to ensure the uniformity of the electrical characteristics of the transistor device as fabricated, in each of the process batches. Furthermore, the relatively flat surface of the fabricated transistor pair, after the metal-gate and contacts are formed, also helps to assist the progress of the subsequent device fabrication procedures.

The above-described preferred embodiment of the present invention is utilized only for the purpose of the description of the present invention. Persons skilled in this art can appreciate the fact that other similar arrangements can be devised from the embodiment disclosed above without departing from the spirit of the present invention, which is recited in the following claims.

I claim:

1. A process for fabricating a high-voltage metal-gate MOS transistor for use in CMOS integrated circuits formed on a semiconductor substrate of a first conductivity type having a well region of a second conductivity type, comprising:
    (a) forming a shielding layer on said well region having a pair of openings spaced-apart to expose a portion of said well region;
    (b) forming lightly-doped source/drain region of said first conductivity type into said well region beneath said openings;
    (c) forming spacers on the sidewall of said openings;
    (d) forming an oxide layer on said lightly-doped source/drain regions utilizing thermal oxidation;
    (e) removing said oxide layer to form recesses;
    (f) forming heavily-doped source/drain regions of said first conductivity type into said lightly-doped source/drain regions beneath said recesses;
    (g) removing said shielding layer and said spacers;
    (h) forming an insulating layer filling in said recesses and a gate dielectric layer covering the region therebetween; and
    (i) forming a metal-gate on said gate dielectric layer.

2. The process for fabricating the high-voltage metal-gate MOS transistor of claim 1, between step (h) and (i), further comprising:
    forming contact windows through said insulating layer to expose a portion of said heavily-doped source/drain regions; and
    forming metal layer to connect with said heavily-doped source/drain regions via said contact windows.

3. The process for fabricating the high-voltage metal-gate MOS transistor of claim 1, wherein said shielding layer is formed of polysilicon.

4. The process for fabricating the high-voltage metal-gate MOS transistor of claim 3, wherein said spacers are formed of nitrides.

5. The process for fabricating the high-voltage metal-gate MOS transistor of claim 1, wherein said shielding layer is formed of oxides.

6. The process for fabricating the high-voltage metal-gate MOS transistor of claim 5, wherein said spacers are formed of nitrides.

7. The process for fabricating the high-voltage metal-gate MOS transistor of claim 1, wherein said first conductivity type is N-type, and said second conductivity type is P-type.

8. The process for fabricating the high-voltage metal-gate MOS transistor of claim 1, wherein said first conductivity type is P-type and said second conductivity type is N-type.

9. A process for fabricating a high-voltage metal-gate MOS transistor for use in CMOS integrated circuits formed on a semiconductor substrate of a first conductivity type, comprising:
    (a) forming a shielding layer on said semiconductor substrate having a pair of openings spaced-apart to expose a portion of said semiconductor substrate;
    (b) forming lightly-doped source/drain region of a second conductivity type into said semiconductor substrate beneath said openings;
    (c) forming spacers on the sidewall of said openings;
    (d) forming an oxide layer on said lightly-doped source/drain regions utilizing thermal oxidation;
    (e) removing said oxide layer to form recesses;
    (f) forming heavily-doped source/drain regions of said second conductivity type into said lightly-doped source/drain regions beneath said recesses;
    (g) removing said shielding layer and said spacers;
    (h) forming an insulating layer filling in said recesses and a gate dielectric layer covering the region therebetween; and
    (i) forming a metal-gate on said gate dielectric layer.

10. The process for fabricating the high-voltage metal-gate MOS transistor of claim 9, between step (h) and (i), further comprising:
    forming contact windows through said insulating layer to expose a portion of said heavily-doped source/drain regions; and
    forming metal layer to connect with said heavily-doped source/drain regions via said contact windows.

11. The process for fabricating the high-voltage metal-gate MOS transistor of claim 9, wherein said shielding layer is formed of polysilicon.

12. The process for fabricating the high-voltage metal-gate MOS transistor of claim 11, wherein said spacers are formed of nitrides.

13. The process for fabricating the high-voltage metal-gate MOS transistor of claim 9, wherein said shielding layer is formed of oxides.

14. The process for fabricating the high-voltage metal-gate MOS transistor of claim 13, wherein said spacers are formed of nitrides.

15. The process for fabricating the high-voltage metal-gate MOS transistor of claim 9, wherein said first conductivity type is N-type, and said second conductivity type is P-type.

16. The process for fabricating the high-voltage metal-gate MOS transistor of claim 9, wherein said first conductivity type is P-type and said second conductivity type is N-type.

* * * * *